United States Patent
Amer et al.

(10) Patent No.: US 8,452,917 B2
(45) Date of Patent: May 28, 2013

(54) LOAD REDUCTION DUAL IN-LINE MEMORY MODULE (LRDIMM) AND METHOD FOR PROGRAMMING THE SAME

(75) Inventors: Maher Amer, Nepean (CA); Michael Lewis Takefman, Nepean (CA)

(73) Assignee: Diablo Technologies Inc., Ottawa (CA)

( * ) Notice: Subject to any disclaimer, the term of this patent is extended or adjusted under 35 U.S.C. 154(b) by 926 days.

(21) Appl. No.: 12/559,185

(22) Filed: Sep. 14, 2009

(65) Prior Publication Data

US 2010/0070690 A1 Mar. 18, 2010

Related U.S. Application Data

(60) Provisional application No. 61/136,550, filed on Sep. 15, 2008, provisional application No. 61/175,562, filed on May 5, 2009.

(51) Int. Cl.
*G06F 12/00* (2006.01)

(52) U.S. Cl.
USPC .................. 711/105; 711/170; 711/E12.001

(58) Field of Classification Search .................. 711/105, 711/170, E12.001
See application file for complete search history.

(56) References Cited

U.S. PATENT DOCUMENTS 6,173,382 B1 * 1/2001 Dell et al. .................. 711/170

OTHER PUBLICATIONS

JEDEC Solid State Technology Association JEDEC Standard DDR3 SDRAM, JESD79-3C www.jedec.org of Nov. 2008.
DDR3 SPD 1.0 Document, Release 1, Item JC-45-2065.01 publication by the Task Group at the Jun. 2008 meeting.

* cited by examiner

*Primary Examiner* — Larry Mackall
(74) *Attorney, Agent, or Firm* — IP-MEX Inc.; Victoria Donnelly

(57) ABSTRACT

A load reduction dual in-line memory module (LRDIMM) is similar to a registered dual in-line memory module (RDIMM) in which control signals are synchronously buffered but the LRDIMM includes a load reduction buffer (LRB) in the data path as well. To make an LRDIMM which appears compatible with RDIMMs on a system memory bus, the serial presence detector (SPD) of the LRDIMM is programmed with modified latency support and minimum delay values. When the dynamic read only memory (DRAMs) devices of the LRDIMM are subsequently set up by the host at boot time based on the parameters provided by the SPD, selected latency values are modified on the fly in an enhanced register phase look loop (RPLL) device. This has the effect of compensating for the delay introduced by the LRB without violating DRAM constraints, and provides memory bus timing for a LRDIMM that is indistinguishable from that of a RDIMM.

29 Claims, 7 Drawing Sheets

LOAD REDUCTION DUAL IN-LINE MEMORY MODULE (LRDIMM) AND METHOD FOR PROGRAMMING THE SAME

RELATED APPLICATIONS

The present application claims benefit from the U.S. provisional application Ser. No. 61/136,550 filed on Sep. 15, 2008, and U.S. provisional application Ser. No. 61/175,562 filed on May 5, 2009, the entire contents of both applications being incorporated herein by reference.

FIELD OF THE INVENTION

The present invention relates in general to the field of computers, and in particular, to memory devices. Still more particularly, the present invention is related to a method and apparatus for enabling interoperation of registered dual in-line memory modules (RDIMMs) and load reduction dual in-line memory modules (LRDIMMs).

BACKGROUND OF THE INVENTION

The memory technology of computers has continuously been evolving in the interest of increased capacity as well as speed. New memory standards are often based on, and nominally compatible with, previous standards, but variations in memory bus protocol often limit the use of newer memory devices in existing computers. Upgrades of the CPU or memory controller hosting the memory may be required, and mixing of memory types on the same memory bus is often not possible, or results in degraded performance.

FIG. 1a shows an exemplary memory system 100 of a computer of the prior art, including a computing host (host) 102 connected to a memory bus 104 that is connected to memory modules 106. The host 102 may include a Basic Input Output System (BIOS) 108, and a memory controller 110 for managing the memory system. Numerous types of memory modules 106 are provided by the industry. At present we are concerned with Dual In-line Memory Modules (DIMMs) in general, and performance enhanced DIMMs in particular.

A DIMM is a module containing one or several Random Access Memory (RAM) or Dynamic RAM (DRAM) chips on a small circuit board with pins that connect it to the computer motherboard. A DIMM has a 240-pin connector and supports 64/72-bit data transfer. The memory devices of performance enhanced DIMMs are generally Synchronous DRAMs (SDRAMs), the terms DRAM and SDRAM being used interchangeably here.

A Registered DIMM (RDIMM) contains a buffer that is used to reduce the loading of the address and control signals on the memory bus.

Each of the memory modules 106 in FIG. 1a include memory devices 112 which are DRAMs; a Register Phase Lock Loop (RPLL) device 114 which is used to buffer a clock and control signals of the memory bus 104; and a Serial Presence Detect (SPD) Electrically Erasable Programmable Read Only Memory (EEPROM) 116 which is connected to the host 102 through a Serial Maintenance bus (SMBus) 118. The RPLL 114 regenerates the clock and bridges the control signals of the memory bus 104 (from the host 102) to a DIMM-internal bus to which the DRAMs are connected, and adds approximately one clock of latency to the control path.

The SPD EEPROM 116 (SPD device) stores specified timing and other parameters pertaining to the memory devices 112 that are located on the same memory module 106. It is typically only accessed by the BIOS 108 of the host 102 over the Serial Maintenance bus (SMBus) 118 during system initialization (booting) in order to automatically configure the timing of the memory bus 104 and the DRAMs 112.

Subsequently, timing of memory control and data signals is provided by the host 102, based on the information obtained from the SPD EEPROM 116 during a boot phase of the host, and the DRAMs 112 are programmed with computed latency values that are derived from the specified parameters where the computed latency values are derived from the specified parameters.

A Load Reduction DIMM (LRDIMM) is a high performance memory module which contains both the buffer for the control path in the RPLL, as well as a load reduction buffer for the data path. The load reduction function of the LRDIMM may be realised in one or more discrete Load Reduction Buffer (LRB) devices or may be performed in a modified RPLL (not shown in FIG. 1a).

Buffering in LRDIMMs results in the addition of at least one clock cycle delay in the control path (the same as in an RDIMM), but there is also delay added in the data path, which will cause a mismatch between the Data Queue Strobe (DQS) on the external memory bus, i.e. the memory bus 104, that carries the DQS signal between the host and the RDIMMs, and the strobe signal at the interface of the DRAM memory device within the LRDIMM. A solution for this problem may be found by changing the programming of the host 102, specifically of the BIOS 108. But no solution is known which would allow an LRDIMM to be used with an existing host without a changed BIOS.

A major issue with integrating LRDIMMs into a memory system that also includes RDIMMs, is that all DIMMs in a system are expected to have the same latency. If one DIMM is slower, then the other DIMMs all will be programmed with the longer latency by the host. The additional delay in the LRB causes a mismatch between the DQS on the memory bus and the buffered DQS at the DRAM within the LRDIMM.

It is evident that memory bus timing for LRDIMMs cannot be the same as for RDIMMs because of the added delay by the LRB in the data path. As a result RDIMMs and LRDIMMs cannot be used in combination on the same bus.

A solution may exist in a replacement or patching of the BIOS in order to permit a host to operate efficiently with LRDIMMs or compatibly with a mixture of DIMM types (RDIMM and LRDIMM) on the memory bus. However, this option is not readily available for existing computers that one may wish to upgrade to LRDIMMs.

Accordingly, there is a need in the industry for the development of an improved LRDIMM, a method for enabling efficient operation of LRDIMMs, and interoperation of RDIMMs and LRDIMMs without making changes to existing host controllers or to the BIOS.

SUMMARY OF THE INVENTION

Therefore there is an object of the present invention to provide an improved LRDIMM, a method for programming the LRDIMM, enabling interoperation of RDIMM and LRDIMM, and a computer memory system comprising the improved LRDIMM, while obviating deficiencies of the prior art.

The methods and apparatus of the embodiments of the invention minimize the number of dead cycles required to allow a Load Reduction DIMM (LRDIMM) to interoperate with existing Registered DIMMs (RDIMM) without making changes to existing host controllers or to the BIOS. The methods and apparatus of the embodiments of the invention also optimize power consumption incurred by on die termination of data signals on the memory bus, by allowing an unnecessary widening of the ODT windows during read and write operations to be avoided According to one aspect of the invention, there is provided a method for programming a load reduction dual inline memory module (LRDIMM), including at least one dynamic random access memory (DRAM), a serial presence detect (SPD) device for storing specified parameters for the LRDIMM, a load reduction buffer (LRB) deployed between the DRAM and a memory bus, a computing host capable of reading the specified parameters from the SPD and programming the DRAM with the specified parameters, the method comprising:

(a) modifying at least one of the specified parameters to obtain modified parameters for the DRAM;
(b) programming the SPD device with the modified parameters;
(c) booting the computing host, comprising:
   (i) determining programming values for the LRDIMM from the SPD modified parameters;
   (ii) modifying said programming values into corresponding modified programming values to account for a delay between the memory bus and DRAM caused by the LRB; and
   (iii) programming the LRDIMM, including sending the modified programming values to the DRAM.

In the embodiments of the invention, the step (i) comprises determining latency programming values. The step (a) comprises modifying a specified supported column address select latency (CL) bitmap. In the method described above, all bits in the CL bitmap have bee shifted to respective next higher value positions.

Preferably, the step (a) comprising modifying a minimum column address select latency time (tAAmin), a minimum write recovery time (tWRmin), and a minimum internal write to read command delay time (tWTRmin) into corresponding modified parameters by increasing each parameter by a respective predetermined amount. The predetermined amount is 1.5 ns, 1.5 ns, and 2.625 ns for tAAmin, tWRmin and tWTRmin respectively, provided the DRAM is a DDR3 grade 1333J device.

The step (i) comprises determining a column address select latency (CL) value; and the step (ii) comprising modifying the CL value into a modified CL value, which is the next lower value in a range of coded CL values.

Alternatively, or additionally, the step (i) comprises determining a column address select write latency (CWL) value; and the step (ii) comprises modifying the CWL value into a modified CWL value, which is the next higher value in a range of coded CWL values.

Alternatively, or additionally, the step (i) comprises determining a write recovery (WR) value; and the step (ii) comprising modifying the WR value into a modified WR value, which is the next lower value in a range of coded WR values.

Alternatively, or additionally, the step (i) comprises determining a coded representation of an additive latency (AL) value; and the step (ii) comprises modifying the coded representation of the AL value provided the coded representation of the AL value has a predetermined value.

In the embodiments of the invention, the coded representation of the AL value indicates the AL being equal to CL−2, and the modified coded representation of the AL value indicates the AL value being equal to CL−1, CL being a coded representation for a column address select latency of the DRAM.

In the method described above, the LRDIMM further comprises a load reduction register phase lock loop (LRPLL) for providing a control path from the memory bus to the DRAM, and the step (i) comprises determining a coded representation of an additive latency (AL) value; the method further comprises inserting an additional 1-clock delay into the control path provided the coded representation of the AL value has a predetermined value.

The predetermined value for the coded representation of the AL is equal to CL−1, CL being a coded representation for a column address select latency of the DRAM.

In one embodiment of the invention, the step (ii) being performed in a Basic Input/Output System (BIOS) connected to the memory bus; and the step (iii) comprising sending the modified programming values from the BIOS to the LRDIMM.

According to another aspect of the invention, there is provided a computer memory system, comprising:

(a) at least one load reduction dual inline memory module (LRDIMM);
(b) a memory bus;
(c) a host coupled to said at least one LRDIMM over the memory bus;
   the LRDIMM comprising:
   (i) a serial presence detect (SPD) device for storing specified parameters and modified parameters for the LRDIMM;
   (ii) at least one dynamic random access memory (DRAM);
   a load reduction buffer (LRB) for bridging data between the DRAM and the memory bus; and
   (iii) a modified latency (ML) circuit for a intercepting original mode register set (MRS) instructions including latency values from the host and forwarding modified MRS instructions including modified latency values to the DRAM, the modified latency values accounting for a delay between the memory bus and the DRAM caused by the LRB; and
(d) means for reading the specified and modified parameters from the SPD device and generating the original MRS instructions from the specified parameters and the modified parameters.

In the embodiments of the invention, the SPD device is an SPD Electrically Erasable Programmable Read Only Memory (EEPROM) for storing specified parameters having values specified for the DRAM, and at least one modified parameter having a value different from the values specified for the DRAM.

The modified parameters include a column address select latency (CL) bitmap, in which all bits in the CL bitmap are shifted to respective next higher value positions.

Alternatively, or additionally, the modified parameters include a minimum column address select latency time (tAAmin), a minimum write recovery time (tWRmin), and a minimum internal write to read command delay time (tWTRmin), each parameter increased by a respective predetermined amount from corresponding values of the specification of the DRAM.

The predetermined amount for the tAAmin, tWRmin, and tWTRmin have been 1.5 ns, 1.5 ns, and 2.625 ns respectively, provided the DRAM is a DDR3 grade 1333J device.

Preferably, the DRAM being a double-data-rate three synchronous dynamic random access memory (DDR3 SDRAM) device.

The latency values of the intercepted original mode register set (MRS) instructions comprise:
   a column address select latency (CL) value;

a column address select write latency (CWL) value; and
a write recovery (WR) value,
and the modified latency values comprising:
  a modified CL value, which is the next lower value in a range of coded CL values;
  a modified CWL value, which is the next higher value in a range of coded CWL values; and
  a modified WR value, which is the next lower value in a range of coded WR values.

The modified latency (ML) circuit includes a mode register one (MR1) modification means for modifying a coded representation of an additive latency (AL) value into a modified coded representation of the AL value, provided the coded representation of the AL value has a predetermined value.

In the computer memory system of the embodiments of the invention, the coded representation of the AL value indicates that the AL is equal to CL−2, and the modified coded representation of the AL value indicates the AL value is equal to CL−1, CL being a coded representation for a column address select latency of the DRAM.

In the computer memory system described above, the LRDIMM further comprises a load reduction register phase lock loop (LRPLL) for providing a control path from the memory bus to the DRAM, the LRPLL including a conditional command delay stage (CCDS) for inserting an additional 1-clock delay into the control path provided the coded representation of the AL value has a predetermined value. Beneficially, the predetermined value is CL−1, CL being a coded representation for a column address select latency of the DRAM.

The computer memory system may further comprise a registered dual inline memory module (RDIMM) connected to the memory bus.

According to yet another aspect of the invention, there is provided a load reduction dual inline memory module (LRDIMM) including a random access memory (DRAM) and a load reduction buffer (LRB) connected to a host over a memory bus, the LRDIMM comprising:
  a modified latency circuit for intercepting original mode register set (MRS) instructions including latency values from the host and forwarding corresponding modified MRS instructions including modified latency values to the DRAM, the modified latency circuit comprising:
  a mode register zero (MR0) modification means for modifying a column address select latency (CL) value, received from the memory bus, into a modified CL value, which is the next lower value in a range of coded CL values, and a write recovery (WR) value into a modified WR value, which is the next lower value in a range of coded WR values, the modified CL and WR values to be transmitted to the DRAM.

In the LRDIMM described above, the modified latency circuit further comprises a mode register two (MR2) modification means for modifying a column address select write latency (CWL) value received from the memory bus, into a modified CWL value, which is the next higher value in a range of coded CWL values to be transmitted to the DRAM.

The modified latency circuit further comprises a mode register one (MR1) modification means for modifying a coded representation of an additive latency (AL) value received from the memory bus, into a modified coded representation of the AL value to be transmitted to the DRAM, provided the coded representation of the AL value has a predetermined value, the coded representation of the AL value indicating the AL being equal to CL−2, and the modified coded representation of the AL value indicating the AL value being equal to CL−1, CL being a coded representation for a column address select latency of the DRAM.

The modified latency circuit further comprises a conditional command delay stage for inserting an additional 1-clock delay into a control path between the memory bus and the DRAM provided the coded representation of the AL value has a predetermined value, the predetermined value being equal to CL−1, CL being a coded representation for a column address select latency of the DRAM.

Thus, an improved LRDIMM, a method for programming LRDIMM, and a computer memory system comprising LRDIMM have been provided.

BRIEF DESCRIPTION OF THE DRAWINGS

Embodiments of the invention will now be described, by way of example, with reference to the accompanying drawings in which.

DESCRIPTION OF THE EMBODIMENTS OF THE INVENTION

A solution to the shortcomings of the prior art is described in the embodiments of the present invention, which aims to enable an LRDIMM work efficiently on memory busses with different clock rates, and to allow LRDIMMs to be mixed with RDIMMs on the same memory bus, even without changes to the BIOS or the memory controller.

Figure 1A:
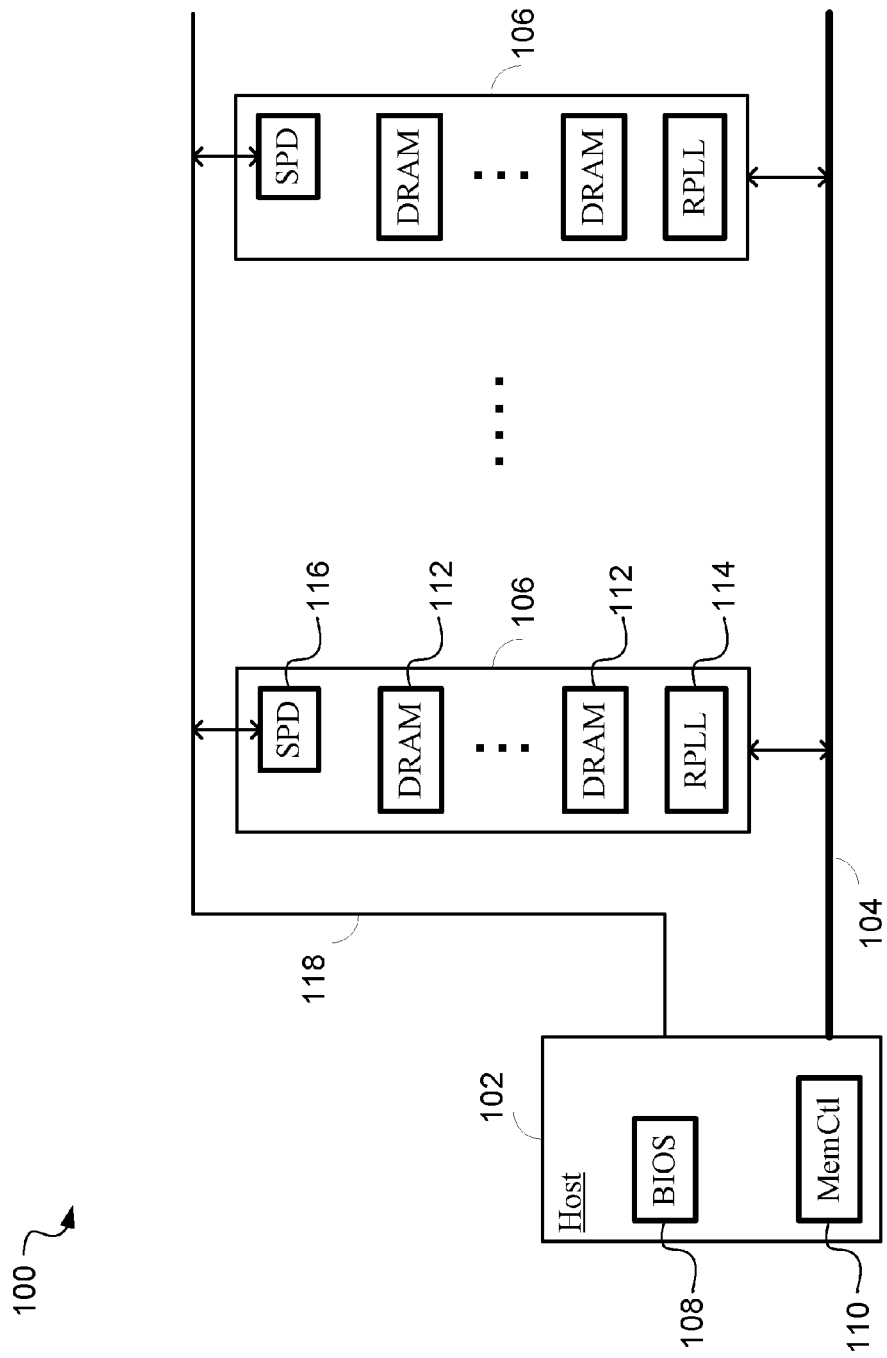
FIG. 1a shows an exemplary memory system 100 of a computer of the prior art, including a host 102 connected to a memory bus 104 that is connected to memory modules 106.
Figure 1B:
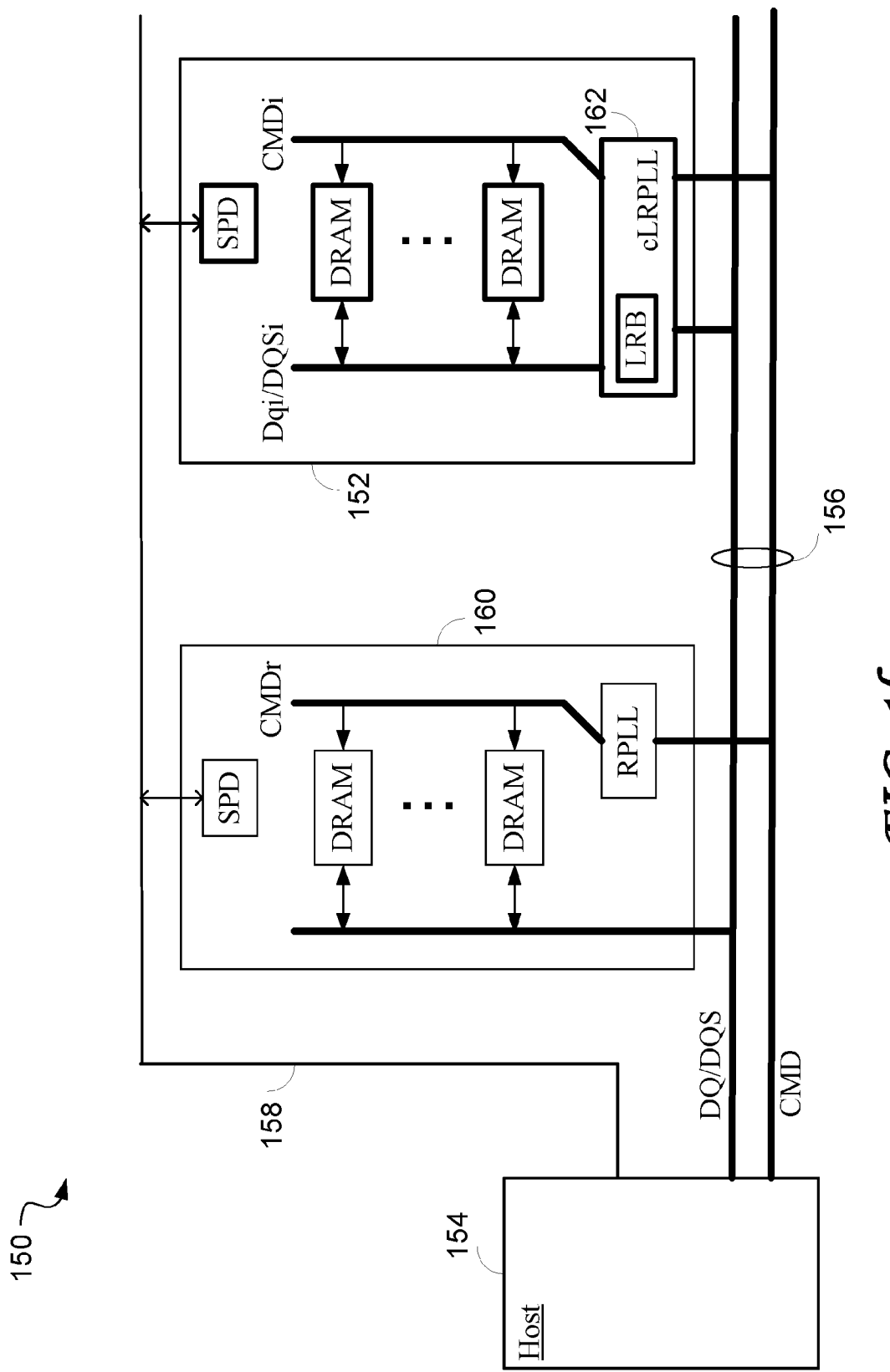
FIG. 1b shows an exemplary computer memory system 150 according to an embodiment of the invention, including at least one load reduction DIMM (LRDIMM) 152.

FIG. 1b shows an exemplary computer memory system 150 according to an embodiment of the invention, including at least one load reduction DIMM (LRDIMM) 152, as well as a conventional host 154, a conventional memory bus 156, a conventional system management bus (SMbus) 158, and zero or more conventional RDIMMs 160, the conventional components being equivalent to the corresponding host 102, memory bus 104, SMbus 118, and memory modules 106 of FIG. 1a.

The memory bus 156 comprises a host-side command bus CMD and a host-side data bus DQ/DQS. In the conventional memory module, the host-side data bus extends directly to the memory devices (DRAMs), while the host-side command bus CMD is buffered and regenerated in the RPLL device as an internal RDIMM command bus CMDr.

On the other hand, in the load reduction DIMM (LRDIMM) 152 the entire host-side memory bus 156 is buffered and regenerated (bridged) through a combined Load-Reduction RPLL (cLRPLL) 162, to form an internal LRDIMM command bus CMDi and an internal LRDIMM data bus DQi/DQSi. The cLRPLL 162 includes a load reduction buffer (LRB) for bridging the host-side data bus DQ/DQS to the internal LRDIMM data bus DQi/DQSi, in addition to a common RPLL. Alternatively, the LRB may be implemented external to the cLRPLL 162, an example of which is described in FIG. 2 following.

The following examples will be based on an LRDIMM populated with DDR3 SDRAMs (DRAMs), as specified in "JEDEC STANDARD DDR3 SDRAM, JESD79-3C of November 2008" published by the JEDEC SOLID STATE TECHNOLOGY ASSOCIATION, and SPD EEPROMs according to a proposed "DDR3 SPD 1.0 Document, Release 1, Item JC-45-2065.01", published by the DDR3 SPD Task Group of JEDEC, the entire contents of both documents being incorporated herein by reference.

However, the present invention should not be construed as being limited to devices that meet these specifications, and may equally apply to other memory types as well.

Figure 2:
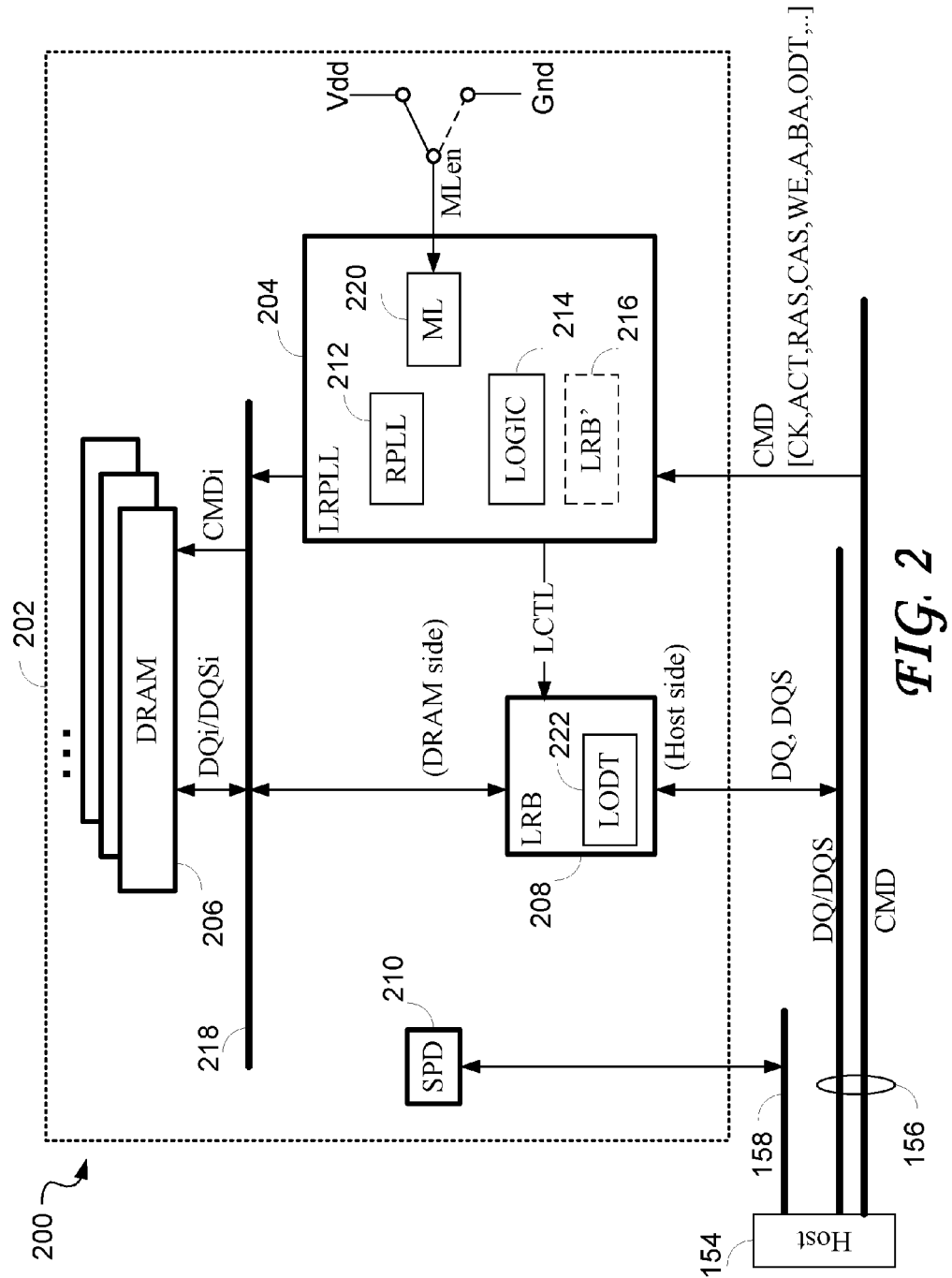
FIG. 2 shows a simplified block diagram 200 of a preferred implementation 202 of the LRDIMM 152 of FIG. 1b, including a Load Reduction RPLL 204 that includes a modified latency (ML) circuit 220.

FIG. 2 shows a simplified block diagram 200 of a preferred implementation 202 of the LRDIMM 152 of FIG. 1*b*, including a Load Reduction RPLL (LRPLL) 204, DRAMs 206, a LRB 208, and a SPD EEPROM 210. The LRPLL 204 comprises a (conventional) RPLL 212 and a control logic circuit 214. The LRB 208 is shown in FIG. 2 external to the LRPLL 204, but in an alternative embodiment an equivalent LRB' 216 (indicated in dashed outline) may be included in the LRPLL 204. Note that the LRB 208 may be a single device or can be distributed in multiple devices, each of which buffers a portion of the data bits.

The SPD EEPROM 210 may be coupled to the standard SMBus 158 (see FIG. 1*b*) for connection to the host.

Data signals (DQ) and Data Strobe (DQS) of the host-side data bus DQ/DQS are connected to host-side terminals of the LRB 208.

The LRDIMM 202 comprises elements to satisfy the DRAM and SPD EEPROM specifications as well as to provide functionality that is expected by the host driving the memory bus 156. For the purposes of the present description, such circuit means will be considered as black boxes, and the disclosure is limited to the novel aspects of the inventive techniques themselves, while referring to functional behavior of the black boxes in accordance with their specifications.

It is usual practice that in the manufacturing of a DIMM, the corresponding SPD EEPROMs are programmed with parameters that reflect or describe parameters of the DIMM as a whole, and of its DRAMs in particular, such as a serial number of the DIMM, types and parameters of the DRAMs, and other similar information. It is one of the features of the invention that the SPD EEPROM 210 of the LRDIMM 202 is programmed with certain values that do not directly reflect the corresponding parameters of the DRAMs 206, but are derived from them and modified, the nature of the modifications designed to accommodate the LRB 208.

A number of unidirectional memory bus control signals (CMD) are connected from the memory bus 156 to the LRPLL 204, including: a bus clock CK; Row and Column Select signals (RAS and CAS); a Write Enable (WE) signal; Address lines (typically A0 to A15); Bank Address signals (BA, typically BA0 to BA2); an On-Die Termination (ODT) signal; and other control signals that are not of relevance to the invention.

The memory bus control signals (CMD) are buffered and/or processed by the LRPLL 204, the result being a set of LRDIMM-internal Control signals (CMDi) that are coupled to the DRAMs 206, for example over at least one internal memory bus 218.

The LRPLL 204 includes a modified latency (ML) circuit 220, which may be enabled dynamically or permanently with a ML enable signal (MLen) that may be provided through a programming pin as shown in FIG. 2. The MLen terminal is tied to a supply voltage or ground on the LRDIMM carrier to respectively enable or disable the modified latency (ML) circuit 220. When the modified latency (ML) circuit 220 is enabled, it performs an on-the-fly modification of latency values, which are programmed into the DRAMs with Mode Register Set commands (MRS). See FIG. 4 below for details on this feature of the invention.

Bidirectional signals, including data signals (DQ) and a Data strobe signal (DQS) are coupled between the memory bus 156 and the LRB 208. These signals are bridged, i.e. buffered in both directions, by the LRB 208, resulting in internal data and data strobe signals (DQi and DQSi) which are coupled to the DRAMs 206, for example over the at least one internal memory bus 218.

The LRB 208 receives a set of LRB Control signals (LCTL) from the LRPLL 204, including clock and directional enable signals for enabling the reception of the DQ and DQS signals on the memory bus 156 and sending corresponding buffered DQi and DQSi signals to the internal memory bus 218 during a memory write operation, and for enabling the reception of the DQi and DQSi signals from the internal memory bus 218 and sending corresponding buffered DQ and DQS signals to the memory bus 156 during a memory read operation.

As provided in the previously referred to DDR3 specification, JEDEC STANDARD DDR3 SDRAM, JESD79-3C of November 2008, the ODT control signal of the memory bus is intended to activate the on-die terminations of the data lines (DQ) and of the data strobe (DQS) in the DRAMs when they are directly connected through stubs (short lengths of physical circuit tracks) to the memory bus 156. However, in the LRDIMM 202 of the embodiment of the invention, the data lines of the memory bus 156 are buffered through the LRB 208, and not connected directly to the DRAMs 206. As a consequence, on-die termination of the memory bus data (DQ and DQS) has to be provided by an ODT function in the LRB 208 instead. The LRB 208 includes a LRB on-die termination circuit (LODT) 222 for terminating the host side bus stubs when requested by the ODT signal from the host. The ODT signal that is received from the host 154 over the memory bus 156 by the LRPLL 204 is regenerated and potentially delayed by the control logic circuit 214 for controlling the ODT function in the LRB 208.

Embodiments of the invention address the need to align the host side of the LRB 208 of the LRDIMM 202 to the clock edge of the memory bus clock CK, in order to make on-line termination work without changes to the host, and to align the signals on the DRAM side of the LRB 208 to an edge of the clock. In other words the delay through the LRB is made into an integer number of clocks by re-clocking the buffered signals. If the circuit delay (in nSec) through the LRB 208 is less than one clock cycle, for an envisaged range of clock rates, then it is rounded up to a one-clock delay. In the following the nominal rounded up delay of the LRB will be taken as a one-clock delay. If the circuit delay were greater than one clock (in the worst case), then the delay through the LRB 208 would have to be rounded up to two clocks or more, but this case is not covered explicitly in the examples given below. Details of the design of the LRB 208 are not provided, as the LRB 208 is treated as a "black box" in this disclosure.

It will be appreciated that the same LRDIMM 202 may be used in systems with different bus clock rates, thus a comparison of absolute delays (measured in nSecs) with the length of a clock cycle is dependent on the actual bus clock rate used. This includes device specifications, such as minimum hold times etc. which are given in absolute figures, e.g. nSecs. These figures are obtained by the host when it is reading the SPD EEPROM. An optimum CL (CAS read latency) is then calculated in the host in terms of number of minimum numbers of clock cycles based on the clock speed. The CWL (CAS write latency) is based on the clock rate of the memory bus and is specified in the JEDEC memory standard. The SPD EEPROM 210 includes lists of DRAM-supported numbers of clock cycles for CL, and the nearest values are selected by the host and sent to the LRDIMM 202 for programming with the selected numbers.

The present invention, in its various embodiments, provides a solution that supports this methodology by including the LRB delay in the relevant SPD data for the DRAM for the purpose of calculating cycle numbers by the host, but subsequently corrects the values sent to program the DRAMs to permit optimal overall timing. In this way, the host can function as if the DIMM were an RDIMM, and modified parameters become loaded into the DRAM, so to speak "behind the host's back".

For example, if the DRAMs 206 of the LRDIMM 202 are programmed to operate with a CAS (column address strobe, or column address select) latency of 8 clocks, then in the read direction the data latency on the memory bus appears to actually be (at least) 9 clocks due to the added one clock delay through the LRB 208 on the path between the DRAM 206 and the memory bus 156, whereas it would only be 8 clocks with a RDIMM (without the LRB). As the ODT function is provided in the LRB 208 and not the DRAM, its timing must follow the timing of the data signals on the memory bus 156, which includes the additional one clock delay through the LRB 208 in the read case. But the DRAM itself must be programmed for the CAS latency of 8 clocks.

The LRDIMM 202 will thus appear to the system as if it were an RDIMM with the same timing characteristics as other RDIMMs that may be on the same memory bus.

Consider hypothetical RDIMM/LDRIMMs that used DRAMs that supports timings of CL (CAS read latency) of {7,8,9} and CWL (CAS write latency) of {5,6,7}. The goal is to find a set of values (CL,CWL) that allow the timings of both DIMMs to appear the same. The addition of the LRB causes an additional clock cycle in both read and write directions. Therefore, the hypothetical LRDIMM requires a CL that is 1 clock smaller than the hypothetical RDIMM and a CWL that is 1 clock larger. In this example, the CL of the hypothetical RDIMM is restricted to values {8,9} and the CWL values are restricted to {5,6}. The actual choice of these values is dependant on the clock speed of the system and we will assume that the final value selected by BIOS is the set (CL,CWL) of (8,5). Therefore an LRDIMM that is programmed with the set (7,6) will function compatibly with the RDIMM once the delay of the LRB is added. The host will program (8,5) in both cases, but the modified latency (ML) circuit 220 changes these values to (7,6) before they are loaded into the DRAM in the hypothetical LRDIMM.

In order to further help the reader understand the invention clearly, the reader is reminded that the initialization of the LRDIMM 202 (or any DIMM using DDR3 DRAMs) includes programming of the DRAMs of the DIMMs by the host for compatibility with the memory bus in terms of various latency values, respecting constraints such as minimum DRAM access times that are provided the SPD EEPROM in each DIMM. Both the host and the programmed DRAMs typically include counters to count out these latency values in order for memory operations to proceed in synchronism between the host and the memory. The delay imposed by the LRB 208 of the LRDIMM 202 is not accounted for by existing calibration practices and host software/firmware that is used to operate with standard RDIMMs.

Embodiments of the invention include hardware modifications that permit an LRDIMM to behave like an RDIMM in terms of latencies and host/memory synchronization. Modified host firmware (BIOS) could be designed to emulate the proposed hardware modifications, and such firmware solutions are hereby included within the scope of the invention.

Figure 3:
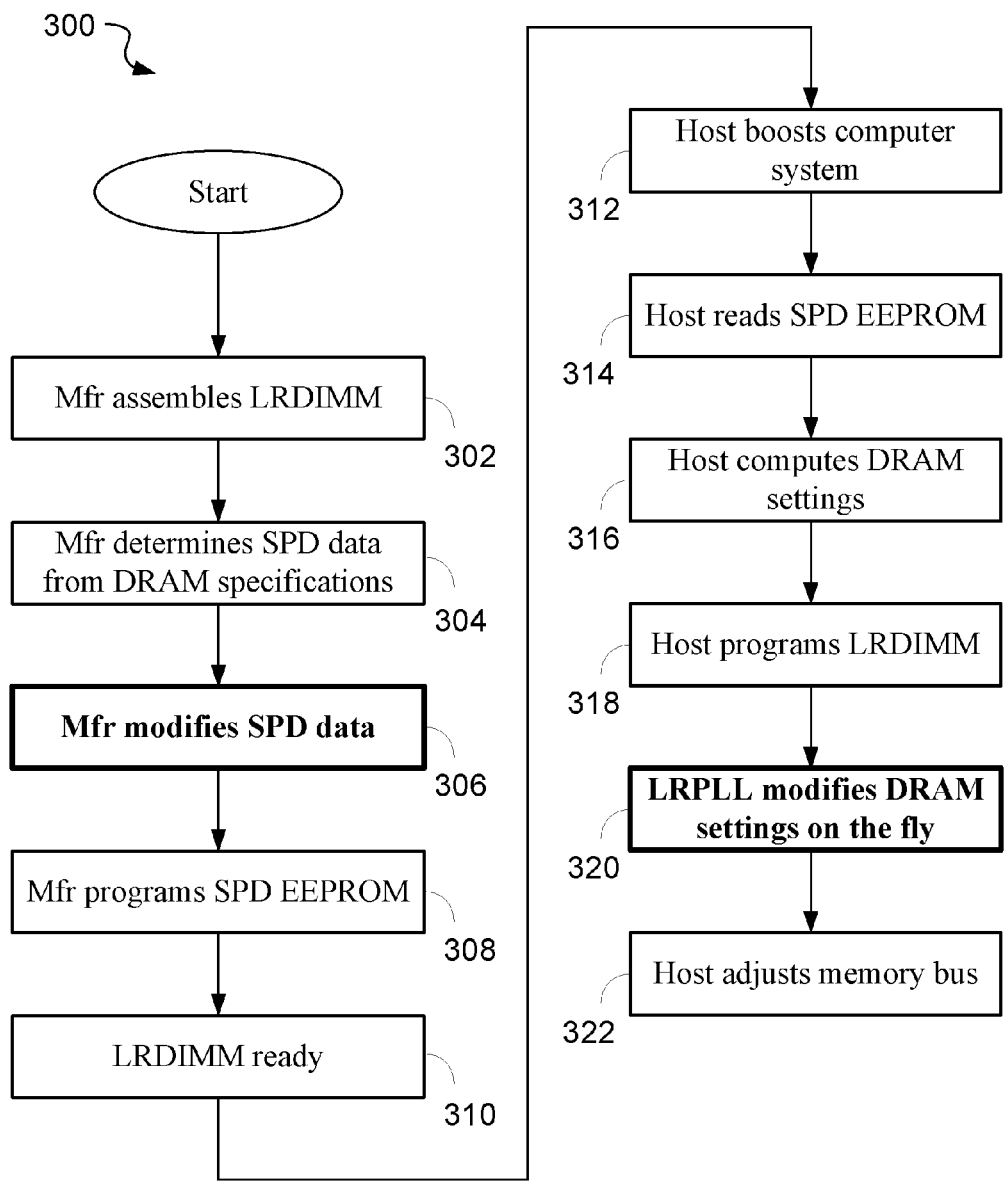
FIG. 3 shows a simplified flow chart 300 of steps in the manufacture of the LRDIMM 202 and subsequent initialization of a memory system that includes the LRDIMM 202 of FIG. 2.

FIG. 3 shows a simplified flow chart 300 of steps in the manufacture of the LRDIMM 202 and subsequent initialization of a memory system that includes the LRDIMM 202 of FIG. 2, including steps:

302: Manufacturer assembles LRDIMM 202;
  304: Manufacturer determines SPD data from DRAM specifications;
  306: Manufacturer modifies SPD data;
  308: Manufacturer programs SPD EEPROM 210; 310: LRDIMM ready;
  312: Host boosts computer system;
  314: Host Reads SPD EEPROM over the SMBus 118;
  316: Host computes DRAM settings;
  318: Host programs LRDIMM (and other DIMMs) using Mode Register Commands;
  320: LRPLL modifies DRAM settings on the fly; and;
  322: Host optionally adjusts the memory bus 156.

The steps 306 "Manufacturer modifies SPD data" and 320 "LRPLL modifies DRAM settings on the fly" are shown bolded in FIG. 3 to more clearly indicate these steps of the method.

The steps 302 to 310 are merely shown in detail as one example of manufacturing steps of an LRDIMM according to embodiments of the invention. The sequence of steps may be varied, for example an LRDIMM may be produced with an SPD EEPROM fully programmed according to existing practices that would also be followed in making RDIMMs as well; the SPD EEPROM could subsequently be re-programmed with values according to the stipulations of the invention (the step 306).

In the step 302 "Manufacturer assembles LRDIMM 202" an LRDIMM is assembled with a blank SPD EEPROM and other components such as selected DRAMs. In this step certain data may be programmed into the SPD EEPROM such as Module (DIMM) identifier codes and the like. Programming the SPD EEPROM may be performed with a conventional EEPROM programming setup which may accept the data for programming from a local area network, and accepts control commands for loading the data into an EEPROM device, such as the SPD EEPROM.

In the step 304 "Manufacturer determines SPD data from DRAM specifications" the set of SPD data would be compiled, according to the type and speed grade of the selected DRAM, for example a set of DRAM specific minimum delay times. The complete set of DRAM (SDRAM) specific SPD data is listed in the "DDR3 SPD 1.0 Document, Release 1, Item JC-45-2065.01". In preparation of the next step, the original DRAM parameters that would normally be programmed into the SPD EEPROM are determined, for example in a component specification data base that is running on a conventional computer, and made available for programming the SPD EEPROM.

The step 306 "Manufacturer modifies SPD data", in bold outline in FIG. 3, is novel according to embodiments of the invention. In the step 306, the following parameters of the SPD data are programmed, or re-programmed: SPD byte 14 (CAS Latencies Supported, Least Significant Byte); SPD byte 15 (CAS Latencies Supported, Most Significant Byte); SPD byte 16 (Minimum CAS Latency Time (tAAmin)); SPD byte 17 (Minimum Write Recovery Time (tWRmin)); and SPD byte 26 (Minimum Internal Write to Read Command Delay Time (tWTRmin)). The modified values may be made available in the component specification data base, and marked specifically for the programming of SPD EEPROM devices for an LRDIMM.

The following table illustrates an example of the modifications to the data pertaining to a particular DDR3 DRAM type, a 1333 MHz grade device 1333J:

| SPD Byte | 1333J spec value | modified value | comment |
|---|---|---|---|
| 14: CAS LSB | 8'b01010100 | 8'b10101000 | change from 10, 8, 6 to 11, 9, 7 |
| 15: CAS MSB | | | no change at this speed grade |
| 16: tAAmin | 8'd120 | 8'd132 | change from 15 ns to 16.5 ns |
| 17: tWRmin | 8'd120 | 8'd132 | change from 15 ns to 16.5 ns |
| 26: tWTRmin | 8'd60 | 8'd81 | change from 7.5 ns to 10.125 ns |

Note that some SPD data are coded values, for example bytes 14 and 15 are in the form of bit maps, where each "1" bit represents a CAS Latency value supported by the DRAM in question. The modified value of byte 14 thus indicates that the CAS Latency values apparently supported by the LRDIMM are higher by one clock cycle compared to the DRAM spec values, thus accounting for a one-clock latency added by the LRB. Note also that, while the SPD is reprogrammed to make the LRDIMM appear slower than the DRAM itself, this effect may be compensated (in the steps 318 and 320) in which a selected CAS Latency is programmed into the LRDIMM (step 320), the selection depending on the memory bus clock rate of the system, but the actual value programmed into the DRAM then being changed in the step 320.

Different grades of DRAM may have different specified values and corresponding modifications, including values in byte 15 (CAS Latencies Supported, Most Significant Byte).

In the step 308 "Manufacturer programs SPD EEPROM 210" the newly established parameters of the SPD data including their modifications are programmed into the SPD EEPROM and are then available for reading by the system in which the LRDIMM will be installed. Programming the SPD EEPROM with the modified parameters may be performed in the same way as in the step 302.

In the step 310 "LRDIMM ready" the LRDIMM is ready to be shipped to be installed in a computer system that supports RDIMMs and where the LRDIMM according to embodiments of the invention will behave correctly, as if it were an RDIMM.

In the step 312 "Host boosts computer system" the power-on sequence of the computer system is executed by the host which includes a boot sequence that comprises initializing the memory. Memory initialization is an established, but quite complex procedure that is well understood by experts only. Only steps which are relevant to the present invention are briefly described in the following. The embodiments of the invention permit this initialization to proceed in a conventional manner from the point of view of the host, such that the unique properties of any LRDIMMs are hidden from the host and are accommodated by procedures that are invisible to the host, i.e. the step 320 (LRPLL modifies DRAM settings on the fly). Boosting of the host is a step commonly controlled through a BIOS program with computer instructions stored in a memory of the host which may be a conventional computer of the prior art. An unmodified BIOS program may be used to boost a host whose memory system includes LRDIMMs according to embodiments of the invention.

In the step 314 "Host Reads SPD EEPROM over the SMBus 118" the host reads the SPD EEPROM of each installed DIMM over the SMBus 118, to determine the presence and the characteristics of the memory modules installed. The step 314 may be one of the steps of a power-on-memory-test sequence that is part of the BIOS.

In the step 316 "Host computes DRAM settings" the firmware in the host compares the characteristics of all memory modules to select a lowest (slowest) common denominator and selects DRAM settings according to an algorithm of the host. The step 316 may be another one of the steps of the power-on-memory-test sequence that is part of the BIOS.

In the step 318 "Host programs DIMMs using Mode Register Commands" the firmware in the host uses Mode Register Commands to program all DRAMs in the system with programming values. In the case of LRDIMMs, programming of the DRAMs is buffered through the LRPLL, as it would be buffered through RPLLs of other DIMMs, but the values programmed into the DRAMs of LRDIMMs are modified programming values, the original programming values being modified on the fly in the modified latency (ML) circuit 220 of each LRDIMM 202. The step 318 may be yet another one of the steps of the power-on-memory-test sequence that is part of the BIOS.

In the step 320 "LRPLL modifies DRAM settings on the fly", some latency values are intercepted in the modified latency (ML) circuit 220 and changed as indicated in the example above, and described generally in the Table 7 (Behavior Modifications Based on AL Programming) shown below. The step 320 is performed in the hardware of the LRDIMM, specifically the modified latency (ML) circuit 220.

In the step 322 "Host optionally adjusts the memory bus 156" bus speed and bus impedance may be adjusted, which may include calibrating the on-die terminations (ODT) of all DIMMs including RDIMMs for optimal bus performance. This includes calibrating the LRB on-die termination circuit (LODT) 222 of the LRB 208 of each LRDIMM 202. The step 322 may be a last major step of the power-on-memory-test sequence that is part of the BIOS.

DRAMs distinguish coded commands which are individually carried out by combinations of states of memory bus control signals sent by the host, specifically RAS, CAS, and WE. The 8 coded commands are Prefetch, Activate, Read, Write, mode register set command (MRS), "ZQCAL" (termination resistor calibration), Refresh, and NOP.

The MRS command is issued by the host, and used in the programming of the DRAMs of the memory system. The MRS command is differentiated into up to 8 MRS sub-commands selected by settings of bank address bits (BA), each of which has a function of setting up timing and other behaviors of the DRAM, using address bits A15 to A0 to convey opcodes controlling internal DRAM settings. Four mode registers (MR0 to MR3) are defined for DDR3 DRAMs.

The mode register fields intercepted for modification by the LRPLL 204 are

CL (CAS Latency) defined in MR0 bits A4-A6;
WR (Write Recovery), minimum in clock cycles defined in MR0 bits A9-A11;
AL (Additive Latency) required to make the memory bus efficient for sustainable bandwidths, defined as either AL=0, AL=CL−1, or AL=CL−2 in a coded representation, in MR1 bits A3-A4; and
CWL (CAS Write Latency) defined in MR2 bits A3-A5.

The overall read and write latencies are RL=AL+CL and WL=WL=AL+CWL respectively.

By reducing CL and increasing CWL in the DRAMs, the effect of the added LRB delay is to compensated so that the overall read and write latencies RL and WL of the LRDIMM are the same as if an RDIMM had been programmed with the same values.

Figure 4:
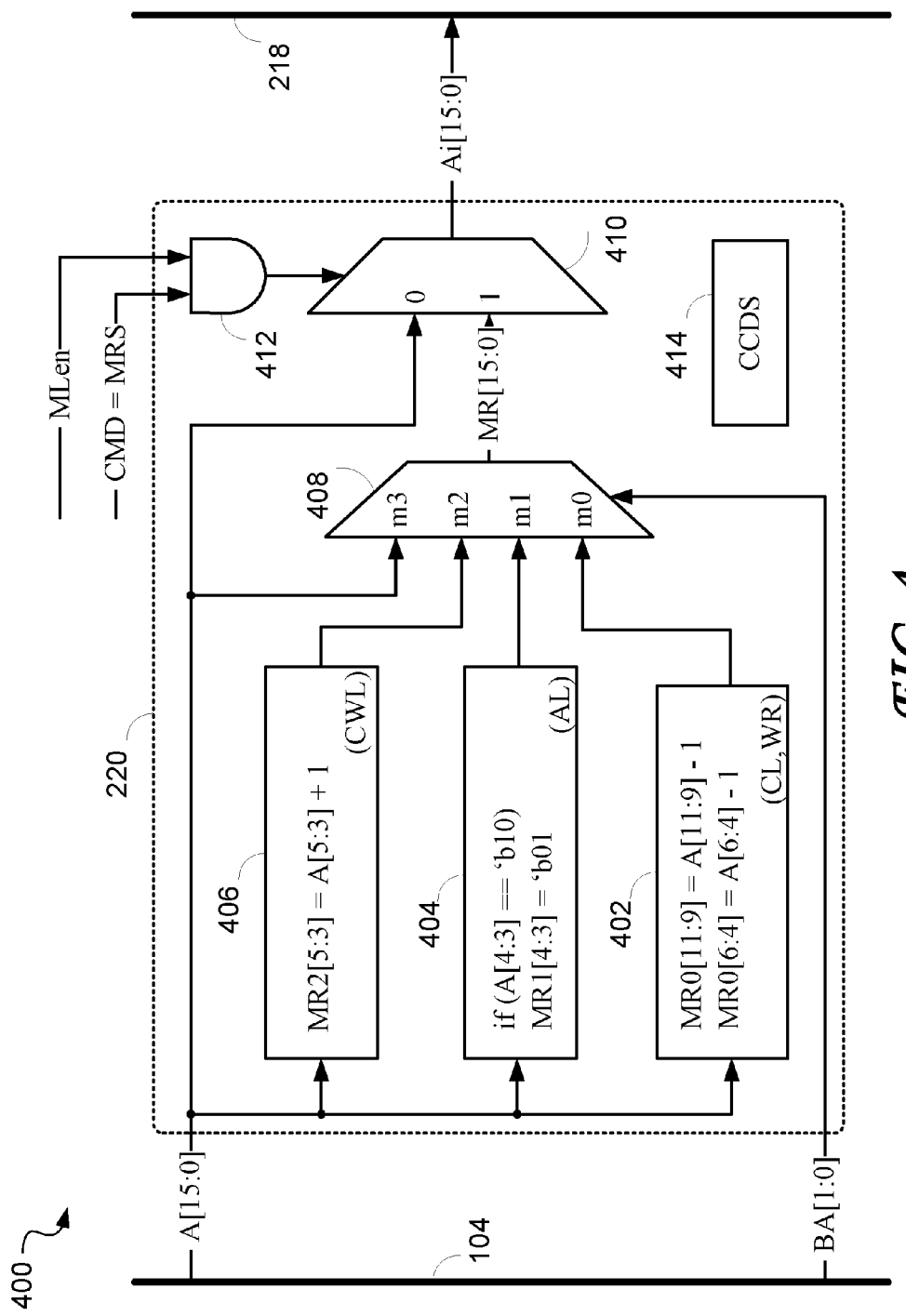
FIG. 4 shows a functional block diagram 400 of the modified latency (ML) circuit 220 of FIG. 2.

FIG. 4 shows a functional block diagram 400 of the modified latency (ML) circuit 220 of FIG. 2, including: MR0 modification means 402; MR1 modification means 404; MR2 modification means 406; a 4:1 selector 408; a 2:1 selector 410; an ANDing means 412; and a conditional command delay stage (CCDS) 414.

The purpose of the modified latency (ML) circuit 220 is to receive the address input bits A[15:0] from the memory bus 156, modify some of these bits, and output modified and unmodified address output bits Ai[15:0] to the internal memory bus 218, and thus the DRAMs 206. The address input bits A[15:0] are interpreted as op-codes during Mode Register Set commands which themselves are decoded by the LRPLL as particular combinations of other memory bus control signals, and where the bank address bits BA[1:0] specify the sets of DRAM mode registers to be set. DRAM Mode Registers and their programming is described in the DDR3 specification (JEDEC STANDARD DDR3 SDRAM, JESD79-3C of November 2008) paragraph 3.4 cited above.

The ANDing means 412 receives the decoded command (CMD=MRS) and the ML enable signal (MLen), and outputs a 2:1 select signal to the 2:1 selector 410. The 2:1 selector 410 has two groups of inputs, a "0" input which receives the sixteen address input bits A[15:0], and a "1" input which receives sixteen mode register bits MR[15:0], some of them modified, from the output of the 4:1 selector 408. The "1" input of the 2:1 selector 410 is only selected when the decoded command (CMD) equals the mode register set command (MRS), and when the ML enable signal (MLen) is "true", indicating that the modified latency (ML) circuit 220 is enabled, otherwise the 2:1 selector 410 forwards the sixteen address input bits A[15:0] unmodified to the internal memory bus 218, and thus to the DRAMs 206.

The 4:1 selector 408 receives four inputs labelled "m0" to "m3", each carrying a sixteen bit set of mode register bits MR0[15:0] to MR3[15:0]. The one of four input is selected by the binary value of the two bank address bits BA[1:0], which the same 2-bit code decoded in the DRAM itself for setting the DRAM mode registers MR0, MR1, MR2, and MR3.

The mode register MR0 includes settings for CAS latency (CL, MR0[6:4]), and for Write Recovery for autoprecharge (WR, MR0[11:9]) which both are 3-bit binary values. The MR0 modification means 402 comprises logic circuitry to evaluate CL and WR and subtract 1 from each, i.e. CL:=CL−1 and WR:=WR−1, and output the modified bits MR0[6:4] and MR0[11:9], as well as the remaining unmodified bits (MR0 [15:12,8:7,3:0]), to the "m0" input of the 4:1 selector 408.

The mode register MR1 includes coded settings for the additive latency (AL, MR1[4:3]) which is a 2-bit code where the binary values of MR1[4:3] of 'b00, 'b01, 'b10, and 'b11 respectively indicate the following four possible cases: AL=0; AL=CL−1; AL=CL−2; and reserved. In the embodiment of the invention, only the case 'b10 (AL=CL−2) is of interest for modification. The MR1 modification means 403 comprises logic circuitry to change this case to 'b01 (AL=CL−1), and output this code along with the remaining unmodified bits (MR1[15:5,2:0]), to the "m1" input of the 4:1 selector 408.

The mode register MR2 includes settings for the CAS write latency (CWL, MR2[5:3]) which is a 3-bit binary value. The MR2 modification means 406 comprises logic circuitry to evaluate CWL and add 1 to it, i.e. CWL:=CWL+1, and output the modified bits MR2[5:3], as well as the remaining unmodified bits (MR0[15:6,2:0]), to the "m2" input of the 4:1 selector 408.

The mode register MR3 includes no settings that require modification. Thus, all sixteen address input bits A[15:0], corresponding to mode register bit (MR3 [15:0]) are forwarded unmodified to the "m3" input of the 4:1 selector 408.

To summarize the function of the modified latency (ML) circuit 220, the register settings CL, WR, and CWL are modified on-the-fly as they are received from the host memory bus 156 and modified into CL−1, WR−1, CWL+1, while AL is not modified unless the MRS command attempts to set it to AL=CL−2 in which case it is modified to AL=CL−1.

The additive latency (AL) is a feature which allows the host to issue read or write commands that will be accepted and pipelined in the DRAM for execution after a delay of AL. But the programmability of AL is limited to the three values, AL=0, AL=CL−1, and AL=CL−2. The resulting total read or write latencies are RL=AL+CL, and WL=AL+CWL.

When AL=0, the nominal read latency RL as expected by the host is then RL=CL. After CL is modified and reduced to CL'=CL−1 in the modified latency (ML) circuit 220, the result is an effective read latency RL' to be provided by the DRAM of CL−1, which (a) is a supported latency in the DRAM because the supported latencies were originally increased by 1 for this purpose, and (b) the read latency seen on the memory bus 156 is the sum of RL' and the one clock delay of the LRB 208, hence RL'+1=RL as expected by the host.

The write latency, WL=CWL is similarly not affected by AL=0, as described earlier.

But when AL=CL−1 is set by the host, the nominal read latency RL as expected by the host is then RL=AL+CL=2*CL−1. After CL is modified and reduced to CL'=CL−1 in the modified latency (ML) circuit 220, the result would be an effective read latency RL' to be provided by the DRAM of RL'=CL'+CL−1=2*CL−2. Since this is one clock cycle too short, a simple solution is to delay the forwarding of the read commands through the LRPLL by an added clock cycle in the conditional command delay stage (CCDS) 414. A more detailed description of the CCDS 414 is not provided as its implementation is straight forward. The CCDS 414 may for example delay the forwarding of all commands (CMD) from the memory bus 156 to the internal memory bus 218 (CMDi), by one clock cycle, if the condition exists that AL=CL−1 was programmed. Delaying the write command this way also corrects the LRDIMM's write latency WL to that expected by the host.

When AL=CL−2 is set by the host, the nominal read latency RL as expected by the host is then RL=AL+CL=2*CL−2. After CL is modified and reduced to CL'=CL−1 in the modified latency (ML) circuit 220, the result would be an effective read latency RL" to be provided by the DRAM of RL"=CL'+CL−2=2*CL−3. This would now be 2 cycles too short which could create a different problem, namely that a specified minimum delay (tRCD) of the DRAM could be violated, which in turn might require another SPD change.

The preferred solution for AL=CL−2 is provided in the modified latency (ML) circuit 220 MR1 where it is detected in the MR1 modification means 404 when the host attempts to set AL=CL−2, and the DRAM is instructed to set AL=CL−1 instead. Then, whithout added delay in the CCDS 414 in this case, the host view of read latency is RL=2*CL−2, and the DRAM view is also RL=2*CL−2.

In general terms, the invention combines a number of techniques to achieve correct programming of an LRDIMM by first supplying, during manufacture of the LRDIMM, modified SPD values which do not exactly match corresponding DRAM values and may in fact appear to be non standard, and secondly at boot time to "snoop" the DRAM mode register programming phase and modify some mode register settings that are sent by the host to the LRDIMM before loading them into the DRAMs. As a third technique, commands sent from the host to the DRAMs on the LRDIMM may be delayed conditionally after a setting of AL=CL−1 from the host has been recorded.

In this way, the BIOS does not need to be aware of the fact that some DIMMs are Registered DIMMs (RDIMMs) and some are Load Reduction DIMMS (LRDIMMs).

Figure 5:
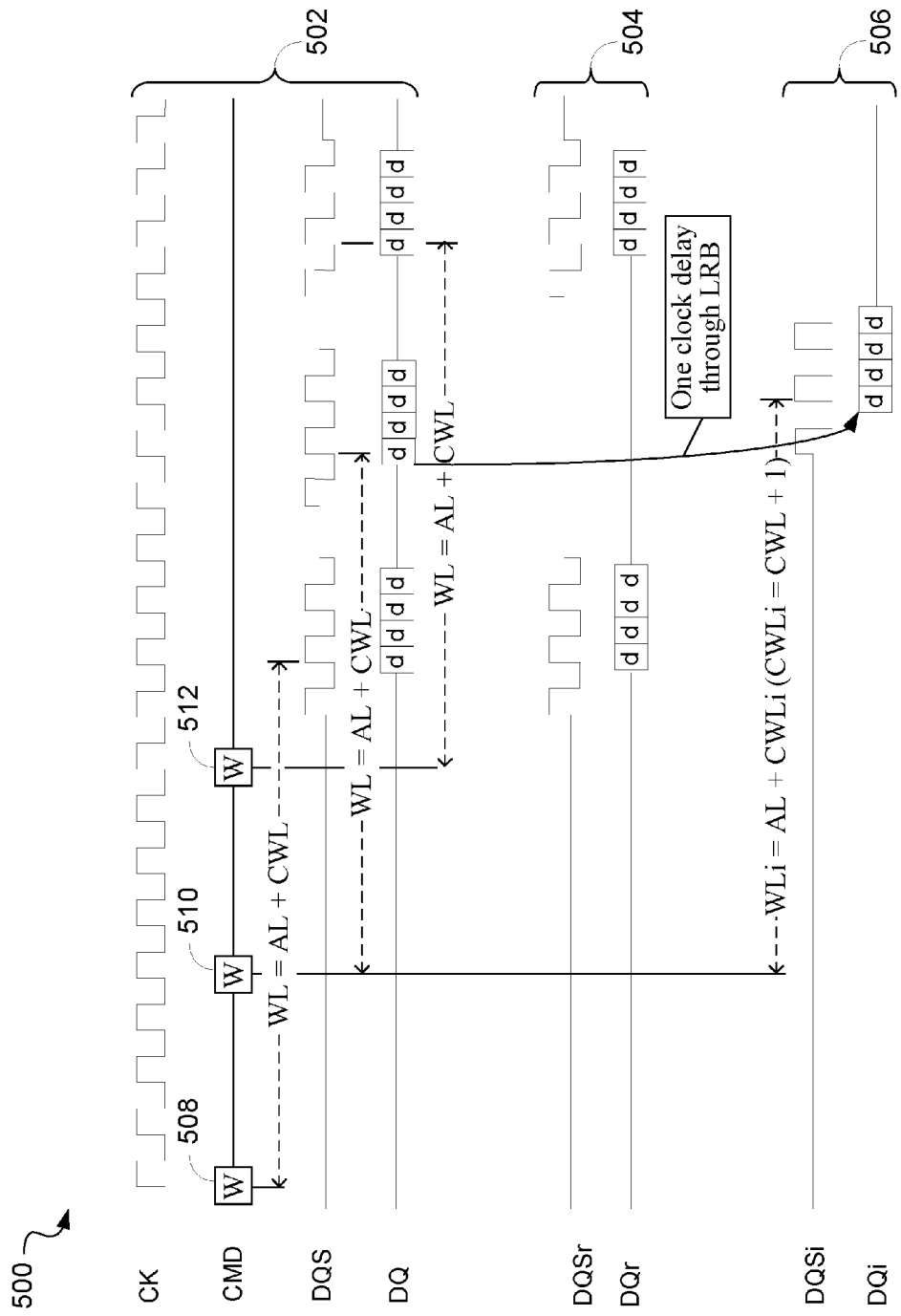
FIG. 5 shows a simplified timing diagram 500 illustrating an example of bus signals during write operations to both a RDIMM and a LRDIMM on the same memory bus.

FIG. 5 shows a simplified timing diagram 500 illustrating an example of bus signals during write operations to both a RDIMM and a LRDIMM on the same memory bus, including a group of host bus memory signals 502, a group of internal RDIMM DRAM signals 504 and a corresponding group 506 of internal LRDIMM DRAM signals.

The group of host bus memory signals 502 comprises a clock (CK) a command (CMD), a data strobe (DQS), and a data signal (DQ). The group of internal RDIMM DRAM signals 504 comprises a RDIMM data strobe (DQSr) and a RDIMM data signal (DQr) which, when the RDIMM DRAMs are selected for writing, are instant (in terms of time) copies of the data strobe (DQS) and the data (DQ) because the data terminals of the RDIMM DRAMS are directly connected to the host memory bus. The group of internal LRDIMM DRAM signals 504 comprises a LDIMM data strobe (DQSi) and a LRDIMM data signal (DQi), which are copies of the data strobe (DQS) and the data signal (DQ) when the RDIMM DRAMs are selected for writing, but delayed by one clock period through the LRB.

Chip select, activation and other signals are not shown but may be easily inferred.

The CMD line shows three consecutive write commands (W) 508, 510, and 512, respectively directed at the RDIMM, the LRDIMM, and at another (or the same) RDIMM, interspersed with periods, shown simply as a straight line, during which NOP (no-operation) commands may be present on the CMD line. The timing shown for the commands is simplified to indicate the occurrence of each command at the input of the DRAM, i.e. one clock period later than on the host memory bus itself; no additive latency is assumed (AL=0).

The DQS line shows three consecutive bursts of data strobe pulses where in each burst, clock edges of the DQS are coincident with the centers of data bits that are present simultaneously on the DQ line.

The DQ line shows three consecutive bursts of four data bits each, respectively intended to be written to the RDIMM, the LRDIMM, and the other (or the same) RDIMM.

Although the system is equally able to use full 8-bit bursts of DQS and DQ instead of truncated 4-bit bursts, the latter only are illustrated in FIG. 5 to avoid cluttering the drawing unnecessarily.

In the memory write operation, the DQ and DQS signals originate in the host, to be consumed by the selected DRAMS.

The DQSr line shows copies of the first and the third of the consecutive bursts of data strobe pulses of DQS, and the DQr line shows copies of the corresponding first and third 4-bit data bursts of the DQ line.

The DQSi and DQi lines of the group of internal LRDIMM DRAM signals 504 show the middle bursts from DQS and DQ of the host bus, and are delayed by one clock cycle through the LRB of the LRDIMM.

To be written into the respective DRAMs, the center of each of the data bits of the data bursts must be close in time to either a positive or a negative edge a data strobe pulse.

The timing diagram 500 also shows a host write latency period of WL=AL+CWL, indicated by dashed lines between each of the three write commands (W) 508, 510, and 512, and the center of the first bit of the corresponding data burst on the DQ line which coincides with an edge of the strobe burst DQS. As mentioned already, the second write command (W) 510 that is directed at the LRDIMM where both DQS and DQ are delayed by the LRB. Thus, an effective LRDIMM write latency WLi from the second write command 510 to the relevant edge of the strobe burst DQSi of the LRDIMM is WLi=AL+CWLi, where CWLi=CWL+1. In other words, in order for the data to be correctly written into the DRAM of the LRDIMM, the DRAM had to be programmed with a CAS write latency value of CWLi=CWL+1, otherwise the DRAM would have expected the data to arrive one clock period earlier than it actually does, resulting in a write error.

The one-clock delay through the LRB is indicated with a curved arrow pointing from the DQ and DQS signals of the host bus to DQSi and DQi.

Figure 6:
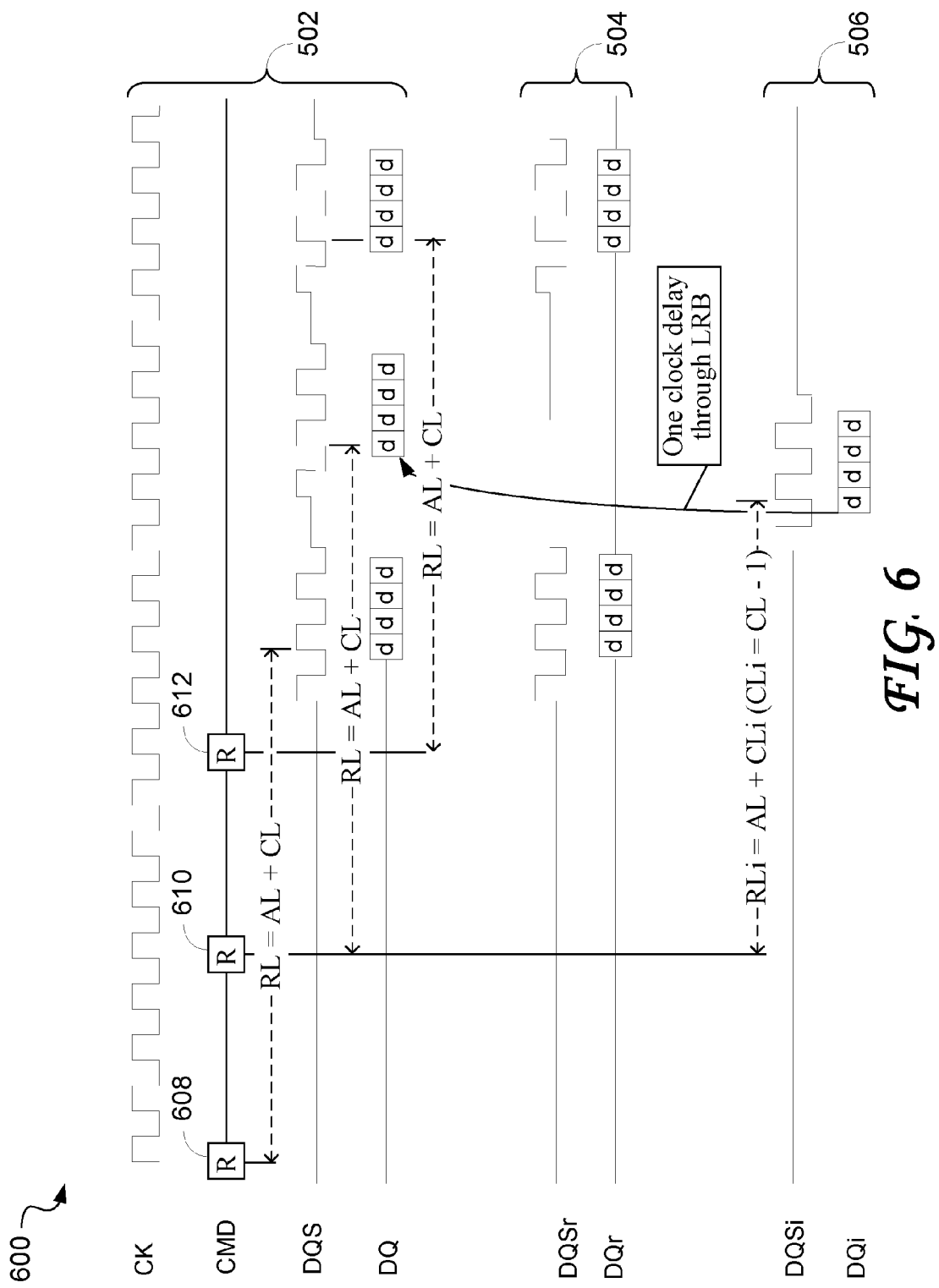
FIG. 6 shows a simplified timing diagram 600 illustrating an example of bus signals during read operations from both a RDIMM and a LRDIMM on the same memory bus.

FIG. 6 shows a simplified timing diagram 600 illustrating an example of bus signals during read operations from both a RDIMM and a LRDIMM on the same memory bus, including the same group of host bus memory signals 502, the same group of internal RDIMM DRAM signals 504 and the same corresponding group 506 of internal LRDIMM DRAM signals as shown in FIG. 5, except that in FIG. 6, the CMD line shows three consecutive read commands (R) 608, 610, and 612, respectively directed at the RDIMM, the LRDIMM, and another (or the same) RDIMM.

In the memory read operation, the DQ and DQS originate from the selected DRAM and must interleave correctly on the memory bus, to be received by the host.

The DQS line shows three consecutive bursts of data strobe pulses where in each burst, clock edges of the DQS are coincident with the centers of data bits that are present simultaneously on the DQ line.

The DQ line shows three consecutive bursts of four data bits each, respectively originating from the RDIMM, the LRDIMM, and the other (or the same) RDIMM. While the DQ and DQS lines show this bursts consecutively occurring on the memory bus, it should be remembered that each burst originates from the corresponding DIMM (RDIMM or LRDIMM), the coordinated timing being due to each DIMM having been programmed with correct latency values.

The DQSr line shows the first and the third of the consecutive bursts of data strobe pulses generated by the DRAM on the RDIMM and placed as DQS on the memory bus. Similarly, the DQr line shows the corresponding first and third 4-bit data bursts of the DQ line generated by the RDIMM and placed as DQ on the memory bus.

The DQSi and DQi lines of the group of internal LRDIMM DRAM signals 504 show bursts generated by the DRAM on the LRDIMM, to be sent through the LRB of the LRDIMM, and are thus delayed by a one-clock delay, before they appear as DQS and DQ on the host memory bus.

The timing diagram 600 also shows a host read latency period of RL=AL+CL, shown in dashed lines between each of the three read commands (R) 608, 610, and 612, and the center of the first bit of the corresponding data burst on the DQ line which coincides with an edge of the strobe burst DQS. The second read command (R) 610 is directed at the LRDIMM whence both DQS and DQ are delayed by one clock period through the LRB. Thus, an effective LRDIMM read latency RLi from the second read command 610 to the relevant edge of the strobe burst DQSi of the LRDIMM is RLi=AL+CLi, where CLi=CL−1. In other words, in order for the data to be correctly sent from the DRAM of the LRDIMM to the host memory bus, the DRAM had to be programmed with a CAS latency value of CLi=CL−1, otherwise the DRAM would have sent the data too late to arrive on the host memory bus than the time slot when the host expects the data to be available, which would result in a read error.

The one-clock delay through the LRB is indicated with a curved arrow from the start of the first bit of the data burst on DQi (sent from the DRAM) to the corresponding first bit of the data burst arriving on DQ.

The timing diagrams of FIGS. 5 and 6 apply strictly only when AL has been programmed as AL=0.

When the additive latency is programmed by the host, i.e. AL=CL−1 or AL=CL−2, the read or write command becomes effective in the DRAM only after the number of clock cycles indicated by the additive latency.

Because AL is defined in terms of CL, and CL is modified to CL−1 when the DRAM is programmed in the modified latency (ML) circuit 220, the additive latency in the DRAM may be incorrect. The safe methods described above (FIG. 4) of simply increasing the actual latency by delaying all commands in the CCDS 414 of the modified latency (ML) circuit 220, and of modifying AL to AL=CL−1 for the DRAM whenever a command AL=CL−2 is detected, ensures that DQ and DQS signals appear correctly and when expected, on both the host memory bus 156 and the internal memory bus 218 of the LRDIMM.

The following summarizes the operation steps for making an LRDIMM equivalent to an RDIMM without requiring changes to the BIOS:

SPD (Serial Presence Detect) EEPROM Programming:
(a) Manufacture LRDIMM using DRAM parts that support CL/CWL timing in the range of 7 to 13;
(b) Program SPD CL range to 8 to 13 (increase supported values by LBR delay);
(c) Program SPD CWL range to 7 to 12 (increase supported values by LBR delay);
(d) Program SPD Minimum CAS Latency Time (tAAmin) (increase original value);
(e) Program SPD Minimum Write Recovery Time (tWRmin) (increase original value);
(f) Program SPD Minimum Internal Write to Read Command Delay Time (tWTRmin) (increase original value).

In System Boot-Up:
(g) BIOS reads SPD EEPROM for all DIMMs and builds internal configuration tables;
(h) BIOS begins to program all DIMMs using MRS commands.

LRPLL Function, with ML Enabled:

(i) Capture (decode) DRAM MRS configuration commands;
(j) if (MRS command sets CL, CWL or WR) then
{ Modify CL value to CL − 1
   Modify CWL value to CWL + 1
   Modify WR value to WR − 1
}
(k) if ( (MRS command sets AL) AND (AL = CL − 1) )
{ Set AL = CL − 2
}
(l) Write MRS operation to DRAM.

The same effect may be achieved with the following steps, which include indicated changes to the BIOS.

SPD (Serial Presence Detect) EEPROM Programming steps (a) to (f) as above;
(m) Program SPD to indicate LRDIMM type.

In System Boot-Up:
(n) BIOS reads SPD EEPROM for all DIMMs and builds internal configuration tables;
(o) BIOS recognizes LRDIMM type and changes CL to (8 to 13) and CWL to (7 to 12);
(p) BIOS programs all LRDIMMs not to snoop or modify MRS commands;
(q) BIOS begins to program all DIMMs using MRS commands.

LRPLL Function with ML Disabled:
(r) Write MRS operation to DRAM.

Note that in the preferred embodiment of the invention, the modify latency (ML) feature of the LRPLL may be turned off by the ML enable signal (MLen) controlled by a hardware programming pin. It would not be difficult to devise a simple method to also allow the BIOS to control MLen in the step (p) above.

Information provided in the following additional sections may further aid in the understanding of the invention.

Due to the fact that the LRDIMM modifies the CL value without the host's knowledge the LRDIMM and the host have a different view of the world when AL is not equal to zero. Unless the DRAM on the LRDIMM and the host both place the pipelined effective read/write command in the same clock cycle and count ordinary latency (CL/CWL) from that point, the data will not arrive at or leave the DRAM at the correct time and operations will fail. Furthermore, it is possible that when using AL=CL−2 the DRAM could violate tRCD as the programmed DRAM CL value is smaller. This may be avoided by substituting AL=CL−1 in this case.

A solution to this problem may be implemented as described in the following. Each case is detailed below (assuming that MLen="true"). Note that incremented and decremented refer to moving to the next value in the programming table of the previously referred to DDR3 specification, JEDEC STANDARD DDR3 SDRAM, JESD79-3C of November 2008, for the given field.

The Register Delay is normally tPDM, which can vary around one clock period. In the case of AL=CL−1 the LRPLL (i.e. the CCDS 414, FIG. 4) will delay all DRAM commands by an extra clock so that they arrive 1 clock later. This effectively cancels out the difference between the host view of AL=CL−1 and the DRAM view of AL=(CL−1)−1.

In the case of AL=CL−2 the challenge is avoiding a violation of tRCD while insuring that the commands arrive at the DRAM. By adjusting the DRAM to a setting of AL−1 rather than AL−2 both the host and the DRAM compute the same effective AL delay, i.e. CL−2=(CL−1)−1.

The following is a summary of both the modify latency operation and a summary of specific example changes made to the DDR-3 SPD for the LRDIMM, and how the BIOS is expected to handle it.

The Modify Latency enable (MLen) bit is used to control a number of operations inside the LRPLL and allows load reduction DIMMs to appear as RDIMMs to the host controller. This has several benefits:

Appearing to the host controller as an RDIMM allows for load reduction DIMMs to work without BIOS changes; and Appearing as an RDIMM allows both load reduction DIMMs and RDIMMs to be populated in the same channel allowing a customer to upgrade load reduction DIMMs into existing systems.

The top level view of the modified latency (ML) circuit 220 operation is that the DRAMs on a LRDIMM are programmed differently than the DRAMs on RDIMMs in the same channel so that the host sees a consistent placement of data on the DQ/DQS bus. The LRDIMM has its CAS Latency (CL) one clock shorter and its CAS Write Latency (CWL) one clock longer which cancels the skew introduced by the LRB.

The skew in write operations has some spill-over effects. As the write actually takes one clock cycle longer in the DRAM than the host is expecting, the SPD has two values programmed to higher numbers in order to force the host to space out commands after writes. The two values are tWR and tWTR. These are increased so that the BIOS would calculate the next highest programmable value. In order for the host and the DRAM to be synchronized it is necessary to modify tWR back down to the correct value, cf. the modification of WR in the MR0 modification means 402.

The following tables give the values that will be programmed into the load reduction DRAM for CWL, the load reduction SPD, the values that BIOS would calculate for an RDIMM (assuming a normal SPD), the values that BIOS should calculate for programming the DRAM for a LRDIMM and the modified values programmed into the DRAM on the LRDIMM.

Table 1 provides numeric examples for resulting values of CWL for different speed grades of DRAMs.

TABLE 1

CWL Values For RDIMM and DRAM on LRDIMM

| All Speed Grades | 800 | 1066 | 1333 |
| --- | --- | --- | --- |
| RDIMM CWL | 5 | 6 | 7 |
| Modified CWL for LRDIMM | 6 | 7 | 8 |

Table 2 below provides numeric examples for resulting values of CL for load reduction SPDs that may be programmed by the BIOS for different speed grades of DRAMs.

TABLE 2 load reduction SPD DIMM CL Programmed by BIOS

| Speed Grade | SPD tAA (min) ns | load reduction SPD DIMM CL (clocks) Programmed by BIOS | | |
| --- | --- | --- | --- | --- |
| | | 800 | 1066 | 1333 |
| 800 D (5, 5, 5) | 15 | 6 | | |
| 800 E (6, 6, 6) | 17.5 | 7 | | |
| 1066 E (6, 6, 6) | 13.125 | 6 | 7 | |
| 1066 G (8, 8, 8) | 16.875 | 7 | 9 | |
| 1333 G (8, 8, 8) | 13.5 | 6 | 8 | 9 |
| 1333 J (10, 10, 10) | 16.5 | 7 | 9 | 11 |

Table 3 below provides numeric examples for resulting values of CL for standard SPDs that may be programmed by the BIOS, for different speed grades of DRAMs.

TABLE 3

Standard SPD RDIMM CL Programmed by BIOS

| Speed Grade | DRAM tAA(min) ns | Standard SPD RDIMM CL (clocks) Programmed by BIOS | | |
| --- | --- | --- | --- | --- |
| | | 800 | 1066 | 1333 |
| 800 D (5, 5, 5) | 12.5 | 5 | | |
| 800 E (6, 6, 6) | 15 | 6 | | |
| 1066 E (6, 6, 6) | 11.25 | 5 | 6 | |
| 1066 G (8, 8, 8) | 15 | 6 | 8 | |
| 1333 G (8, 8, 8) | 12 | 5 | 7 | 8 |
| 1333 J (10, 10, 10) | 15 | 6 | 8 | 10 |

Table 4 below provides numeric examples for resulting values of tAA for load reduction SPDs that will be seen by the host, for different speed grades of DRAMs.

TABLE 4

Host View Final tAA Value

| Speed Grade | SPD tAA (min) ns | load reduction SPD DIMM tAA | | |
| --- | --- | --- | --- | --- |
| | | 800 | 1066 | 1333 |
| 800 D (5, 5, 5) | 15 | 15 | | |
| 800 E (6, 6, 6) | 17.5 | 17.5 | | |
| 1066 E (6, 6, 6) | 13.125 | 15 | 13.125 | |
| 1066 G (8, 8, 8) | 16.875 | 17.5 | 16.875 | |
| 1333 G (8, 8, 8) | 13.5 | 15 | 15 | 13.5 |
| 1333 J (10, 10, 10) | 16.5 | 17.5 | 16.875 | 16.5 |

Table 5 below lists values of tWR for all speed grades with 15 ns SPDs where tWR is programmed for 16.5 ns.

TABLE 5 tWR Values For DRAM on RDIMM and LRDIMM

| All Speed Grades | 800 | 1066 | 1333 |
| --- | --- | --- | --- |
| RDIMM tWR | 6 | 8 | 10 |
| load reduction tWR | 7 | 10 | 12 |
| DRAM Setting | 6 | 8 | 10 |

Table 6 below shows tWTR is selected by max (4CK, SPD), when SPD tWTR is programmed to 10.1 ns.

TABLE 6 tWTR Values For DRAM on RDIMM and LRDIMM

| All Speed Grades | 800 | 1066 | 1333 |
| --- | --- | --- | --- |
| RDIMM tWTR | 4 | 4 | 5 |
| load reduction tWTR | 5 | 6 | 7 |

Table 7 summarises how CL, CWL, and WR are incremented and decremented in the DRAM of the LRDIMM depending on the setting of AL from the host. Note that increment and decrement refer to moving to the next value in the programming table of the previously referred to DDR3 specification, JEDEC STANDARD DDR3 SDRAM, JESD79-3C of November 2008, for the given field.

TABLE 7

Behavior Modifications Based on AL Programming

|  | AL = 0 | AL = CL − 1 | AL = CL − 2 |
|---|---|---|---|
| Modification of DRAM Settings | CL decremented<br>CWL incremented<br>WR decremented | CL decremented<br>CWL incremented<br>WR decremented | CL decremented<br>CWL incremented<br>WR decremented<br>AL decremented |
| Register Delay | Normal | 1 Extra CK | Normal |

Some care must be taken when switching the delay of the LRPLL 204 command output to the internal memory bus 218 when AL is programmed to CL−1. Specifically the LRPLL must insure that the switch does not cause the same command to be issued twice to the DRAM.

In addition to other advantages of the present invention, the methods and apparatus of the embodiments of the invention optimize power consumption incurred by on die termination of data signals on the memory bus, by allowing an unnecessary widening of the ODT windows during read and write operations to be avoided.

Thus, an improved LRDIMM, a computer memory system comprising the LRDIMM, and a method for programming the LRDIMM enabling interoperation of the registered dual in-line memory modules (RDIMM) and load reduction dual in-line memory modules (LRDIMM) without making changes to existing host controllers or to the BIOS, have been provided.

Numerous modifications and variations of the present invention are possible in light of the above teachings. It is therefore to be understood that within the scope of the given system characteristics, the invention may be practiced otherwise than as specifically described herein.

Although the embodiment of the invention has been described in detail, it will be apparent to one skilled in the art that variations and modifications to the embodiment may be made within the scope of the following claims.

What is claimed is:

1. A method for programming a load reduction dual inline memory module (LRDIMM), including at least one dynamic random access memory (DRAM), a serial presence detect (SPD) device for storing specified parameters for the LRDIMM, a load reduction buffer (LRB) deployed between the DRAM and a memory bus, a computing host capable of reading the specified parameters from the SPD and programming the DRAM with the specified parameters, the method comprising:
   (a) modifying at least one of the specified parameters to obtain modified parameters for the DRAM, comprising modifying a specified supported column address select latency (CL) bitmap;
   (b) programming the SPD device with the modified parameters;
   (c) booting the computing host, comprising:
      (i) determining programming values for the LRDIMM from the SPD modified parameters;
      (ii) modifying said programming values into corresponding modified programming values to account for a delay between the memory bus and DRAM caused by the LRB; and
      (iii) programming the LRDIMM, including sending the modified programming values to the DRAM.

2. The method of claim 1, the step (i) comprising determining latency programming values.

3. The method of claim 1, comprising shifting all bits in the CL bitmap to respective next higher value positions.

4. The method of claim 1, the step (a) comprising modifying a minimum column address select latency time (tAAmin), a minimum write recovery time (tWRmin), and a minimum internal write to read command delay time (tWTRmin) into corresponding modified parameters by increasing each parameter by a respective predetermined amount.

5. The method of claim 4, the predetermined amount for tAAmin, tWRmin and tWTRmin being respectively 1.5 ns, 1.5 ns, and 2.625 ns, provided the DRAM is a DDR3 grade 1333J device.

6. The method of claim 1, the step (i) comprising determining a column address select latency (CL) value; and the step (ii) comprising modifying the CL value into a modified CL value, which is the next lower value in a range of coded CL values.

7. The method of claim 1, the step (i) comprising determining a column address select write latency (CWL) value; and the step (ii) comprising modifying the CWL value into a modified CWL value, which is the next higher value in a range of coded CWL values.

8. The method of claim 1, the step (i) comprising determining a write recovery (WR) value; and the step (ii) comprising modifying the WR value into a modified WR value, which is the next lower value in a range of coded WR values.

9. The method of claim 1, the step (i) comprising determining a coded representation of an additive latency (AL) value; and the step (ii) comprising modifying the coded representation of the AL value provided the coded representation of the AL value has a predetermined value.

10. The method of claim 9, the coded representation of the AL value indicating the AL being equal to CL−2, and the modified coded representation of the AL value indicating the AL value being equal to CL−1, CL being a coded representation for a column address select latency of the DRAM.

11. The method of claim 1, the LRDIMM further comprising a load reduction register phase lock loop (LRPLL) for providing a control path from the memory bus to the DRAM, the step (i) comprising determining a coded representation of an additive latency (AL) value; the method further comprising inserting an additional 1-clock delay into the control path provided the coded representation of the AL value has a predetermined value.

12. The method of claim 11, the predetermined value being equal to CL−1, CL being a coded representation for a column address select latency of the DRAM.

13. The method of claim 1, the step (ii) being performed in a Basic Input/Output System (BIOS) connected to the memory bus; and the step (iii) comprising sending the modified programming values from the BIOS to the LRDIMM.

14. A computer memory system, comprising:
   (a) at least one load reduction dual inline memory module (LRDIMM);
   (b) a memory bus;

(c) a host coupled to said at least one LRDIMM over the memory bus;
the LRDIMM comprising:
(i) a serial presence detect (SPD) device for storing specified parameters and modified parameters for the LRDIMM;
(ii) at least one dynamic random access memory (DRAM);
a load reduction buffer (LRB) for bridging data between the DRAM and the memory bus; and
(iii) a modified latency (ML) circuit for a intercepting original mode register set (MRS) instructions including latency values from the host and forwarding modified MRS instructions including modified latency values to the DRAM, the modified latency values accounting for a delay between the memory bus and the DRAM caused by the LRB; and
(d) means for reading the specified and modified parameters from the SPD device and generating the original MRS instructions from the specified parameters and the modified parameters.

15. The computer memory system of claim 14, the SPD device being an SPD Electrically Erasable Programmable Read Only Memory (EEPROM) for storing specified parameters having values specified for the DRAM, and at least one modified parameter having a value different from the values specified for the DRAM.

16. The computer memory system of claim 15, the modified parameters including a minimum column address select latency time (tAAmin), a minimum write recovery time (tWRmin), and a minimum internal write to read command delay time (tWTRmin), each parameter increased by a respective predetermined amount from corresponding values of the specification of the DRAM.

17. The computer memory system of claim 16, the predetermined amount for tAAmin, tWRmin and tWTRmin being respectively 1.5 ns, 1.5 ns, and 2.625 ns, provided the DRAM is a DDR3 grade 1333J device.

18. The computer memory system of claim 14, the modified parameters including a column address select latency (CL) bitmap, in which all bits in the CL bitmap are shifted to respective next higher value positions.

19. The computer memory system of claim 14, the DRAM being a double-data-rate three synchronous dynamic random access memory (DDR3 SDRAM) device.

20. The computer memory system of claim 14, the latency values of the intercepted original mode register set (MRS) instructions comprising one or more of the following:
a column address select latency (CL) value;
a column address select write latency (CWL) value; and
a write recovery (WR) value,
and the modified latency values comprising:
a modified CL value, which is the next lower value in a range of coded CL values;
a modified CWL value, which is the next higher value in a range of coded CWL values; and
a modified WR value, which is the next lower value in a range of coded WR values.

21. The computer memory system of claim 14, the modified latency (ML) circuit including a mode register one (MR1) modification means for modifying a coded representation of an additive latency (AL) value into a modified coded representation of the AL value, provided the coded representation of the AL value has a predetermined value.

22. The computer memory system of claim 21, the coded representation of the AL value indicating the AL being equal to CL−2, and the modified coded representation of the AL value indicating the AL value being equal to CL−1, CL being a coded representation for a column address select latency of the DRAM.

23. The computer memory system of claim 14, the LRDIMM further comprising a load reduction register phase lock loop (LRPLL) for providing a control path from the memory bus to the DRAM, the LRPLL including a conditional command delay stage (CCDS) for inserting an additional 1-clock delay into the control path provided the coded representation of the AL value has a predetermined value.

24. The computer memory system of claim 23, the predetermined value being CL−1, CL being a coded representation for a column address select latency of the DRAM.

25. The computer memory system of claim 14, further comprising a registered dual inline memory module (RDIMM) connected to the memory bus.

26. A load reduction dual inline memory module (LRDIMM), including a random access memory (DRAM) and a load reduction buffer (LRB), the LRDIMM connected to a host over a memory bus, the LRDIMM comprising:
a modified latency circuit for intercepting original mode register set (MRS) instructions including latency values from the host and forwarding corresponding modified MRS instructions including modified latency values to the DRAM, the modified latency circuit comprising:
a mode register zero (MR0) modification means for modifying a column address select latency (CL) value, received from the memory bus, into a modified CL value, which is the next lower value in a range of coded CL values, and a write recovery (WR) value into a modified WR value, which is the next lower value in a range of coded WR values, the modified CL and WR values to be transmitted to the DRAM.

27. The LRDIMM of claim 26, the modified latency circuit further comprising a mode register two (MR2) modification means for modifying a column address select write latency (CWL) value received from the memory bus, into a modified CWL value, which is the next higher value in a range of coded CWL values to be transmitted to the DRAM.

28. The LRDIMM of claim 26, the modified latency circuit further comprising a mode register one (MR1) modification means for modifying a coded representation of an additive latency (AL) value received from the memory bus, into a modified coded representation of the AL value to be transmitted to the DRAM, provided the coded representation of the AL value has a predetermined value, the coded representation of the AL value indicating the AL being equal to CL−2, and the modified coded representation of the AL value indicating the AL value being equal to CL−1, CL being a coded representation for a column address select latency of the DRAM.

29. The modified latency circuit of claim 26, further comprising a conditional command delay stage for inserting an additional 1-clock delay into a control path between the memory bus and the DRAM provided the coded representation of the AL value has a predetermined value, the predetermined value being equal to CL−1, CL being a coded representation for a column address select latency of the DRAM.

* * * * *